(12) United States Patent
Shimizu et al.

(10) Patent No.: US 12,276,672 B2
(45) Date of Patent: Apr. 15, 2025

(54) SENSOR DEVICE

(71) Applicant: Sumitomo Wiring Systems, Ltd., Yokkaichi (JP)

(72) Inventors: Moriyuki Shimizu, Yokkaichi (JP); Masaharu Nakamura, Yokkaichi (JP); Rieko Nagao, Yokkaichi (JP); Hiroki Muramatsu, Yokkaichi (JP); Koichi Kato, Yokkaichi (JP); Toshinari Kobayashi, Yokkaichi (JP); Yukitoshi Terasaka, Yokkaichi (JP); Kyungwoo Kim, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 262 days.

(21) Appl. No.: 17/907,319

(22) PCT Filed: Mar. 12, 2021

(86) PCT No.: PCT/JP2021/010048
§ 371 (c)(1),
(2) Date: Sep. 26, 2022

(87) PCT Pub. No.: WO2021/193142
PCT Pub. Date: Sep. 30, 2021

(65) Prior Publication Data
US 2023/0110687 A1    Apr. 13, 2023

(30) Foreign Application Priority Data

Mar. 27, 2020  (JP) ................. 2020-057491

(51) Int. Cl.
*G01P 1/02*    (2006.01)
*H01B 7/02*    (2006.01)
(Continued)

(52) U.S. Cl.
CPC ............... *G01P 1/02* (2013.01); *H01B 7/02* (2013.01); *H01B 7/282* (2013.01); *H05K 7/02* (2013.01)

(58) Field of Classification Search
CPC .. G01P 1/02; G01P 1/026; H01B 7/02; H01B 7/282; H05K 7/02; G01D 11/245
See application file for complete search history.

(56) References Cited

U.S. PATENT DOCUMENTS

2009/0078043 A1* 3/2009 Tsuda ................. B29C 45/1671
                                                         73/431
2015/0177025 A1* 6/2015 Mizunuma ............... G01D 5/14
                                                       324/207.25
(Continued)

FOREIGN PATENT DOCUMENTS

JP    2004198240 A  *  7/2004 ............. B29C 70/72
JP    2009-262548 A    11/2009
(Continued)

OTHER PUBLICATIONS

International Search Report, Application No. PCT/JP2021/010048, mailed Jun. 1, 2021.

*Primary Examiner* — Francis C Gray
(74) *Attorney, Agent, or Firm* — Honigman LLP

(57) ABSTRACT

An object is to further improve the waterproofness between an end portion of a wiring member and a resin molded part. Disclosed is a sensor device including: a sensor element; a wiring member connected to the sensor element; a first resin molded part that covers the sensor element and an end portion of the wiring member; and a second resin molded part molded separately from the first resin molded part and combined with the first resin molded part into an integral piece.

5 Claims, 4 Drawing Sheets

(51) Int. Cl.
  *H01B 7/282* (2006.01)
  *H05K 7/02* (2006.01)

(56) References Cited

U.S. PATENT DOCUMENTS

2015/0189783 A1  7/2015  Schillinger et al.
2017/0153265 A1  6/2017  Yamamoto et al.

FOREIGN PATENT DOCUMENTS

JP       4555510 B2  * 10/2010  ........... G01D 11/245
JP     2016-017939 A    2/2016
TW      200946014 A  * 11/2009  ......... H01R 13/6592

* cited by examiner

SENSOR DEVICE

CROSS-REFERENCE TO RELATED APPLICATIONS

This application is the U.S. national stage of PCT/JP2021/010048 filed on Mar. 12, 2021, which claims priority of Japanese Patent Application No. JP 2020-057491 filed on Mar. 27, 2020, the contents of which are incorporated herein.

TECHNICAL FIELD

The present disclosure relates to a sensor device.

BACKGROUND

JP 2017-096828A discloses that a plurality of output wire parts are connected to a detection element part, the plurality of output wire parts being bundled as a sheath wire, and that the detection element part and an end portion of the sheath wire are embedded in a resin molded part.

For a configuration in which an end portion of a wiring member is embedded in a resin molded part, it is desired to further improve the waterproofness between the outer circumference of the wiring member and the resin molded part.

Therefore, an object of the present disclosure is to further improve the waterproofness between an end portion of a wiring member and a resin molded part.

SUMMARY

A sensor device according to the present disclosure is a sensor device including: a sensor element; a wiring member connected to the sensor element; a first resin molded part that covers the sensor element and an end portion of the wiring member; and a second resin molded part molded separately from the first resin molded part and combined with the first resin molded part into an integral piece.

ADVANTAGEOUS EFFECTS

According to the present disclosure, the waterproofness between an end portion of a wiring member and a resin molded part is further improved.

DETAILED DESCRIPTION OF PREFERRED EMBODIMENTS

Figure 1:
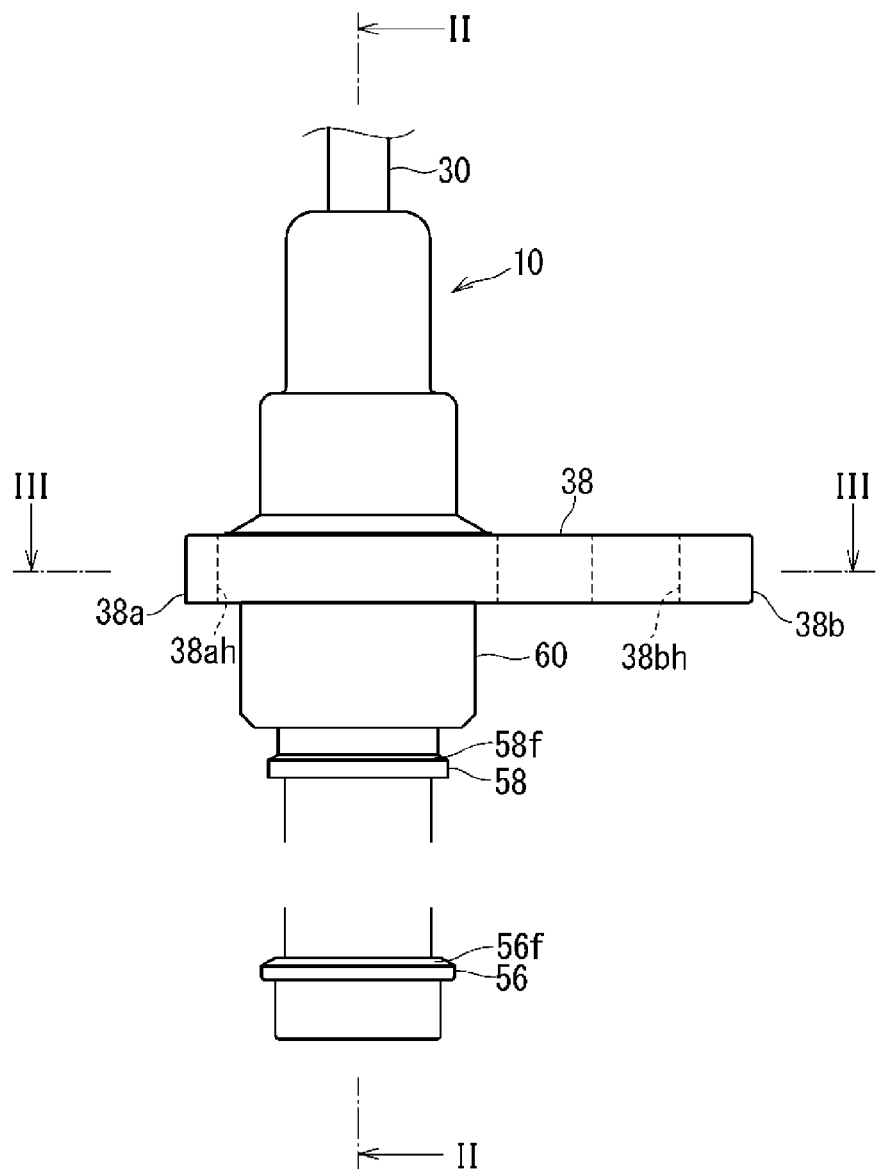
FIG. 1 is a front view showing a sensor device according to an embodiment.

First, aspects of the present disclosure will be listed and described.

A sensor device according to the present disclosure is as follows.

First Aspect

In a first aspect, a sensor device according to the present disclosure is a sensor device including: a sensor element; a wiring member connected to the sensor element; a first resin molded part that covers the sensor element and an end portion of the wiring member; and a second resin molded part molded separately from the first resin molded part and combined with the first resin molded part into an integral piece. According to this sensor device, the thermal effect on the wiring member is reduced since the first resin molded part and the second resin molded part are molded separately. This results in, for example, suppression of the contraction of the wiring member, and reduction of sink marks due to a reduced thickness of the resin portion, thus making it possible to further improve the waterproofness between the end portion of the wiring member and the resin molded part. In addition, as a result of the first resin molded part and the second resin molded part being combined, a desired shape as the sensor device is formed.

Second Aspect

In a second aspect of the sensor device in accordance with the first aspect, the first resin molded part and the second resin molded part may separately and directly cover regions of the end portion of the wiring member that are different in an extension direction of the wiring member. The length by which each of the first resin molded part and the second resin molded part directly covers the end portion of the wiring member is reduced. Accordingly, when molding the first resin molded part and the second resin molded part, it is possible to eliminate or reduce the locations at which the wiring member is positioned within a mold space. This further improves the waterproofness.

Third Aspect

In a third aspect of the sensor device in accordance with the second aspect, the first resin molded part and the second resin molded part continuously may cover the end portion of the wiring member. Since the first resin molded part and the second resin molded part continuously cover the end portion of the wiring member, the waterproofness is further improved.

Fourth Aspect

In a fourth aspect of the sensor device in accordance with any one of the first to the third aspects, the first resin molded part may include a plurality of resin-stopping annular protrusions, and the second resin molded part may cover a portion of the first resin molded part while the second resin molded part is continuous with one of the plurality of resin-stopping annular protrusions. The region in which the second resin molded part covers the first resin molded part can be flexibly adjusted using the plurality of resin-stopping annular protrusions.

Fifth Aspect

In a fifth aspect of the sensor device in accordance with the fourth aspect, the plurality of resin-stopping annular protrusions may include a first resin-stopping annular protrusion, and a second resin-stopping annular protrusion formed at a position more distant from the sensor element than the first resin-stopping annular protrusion is, and the second resin molded part may cover a portion of the first resin molded part that extends from the second resin-stopping annular protrusion toward a side on which the wiring member extends. A portion located away from the sensor element can be covered by the second resin molded part.

Sixth Aspect

In a sixth aspect of the sensor device in accordance with the fourth aspect, the plurality of resin-stopping annular protrusions may include a first resin-stopping annular protrusion, and a second resin-stopping annular protrusion formed at a position more distant from the sensor element than the first resin-stopping annular protrusion is, and the second resin molded part may cover a portion of the first resin molded part that extends from the first resin-stopping annular protrusion toward a side on which the wiring member extends. A portion located close to the sensor element can be covered by the second resin molded part.

Specific examples of the sensor device according to the present disclosure will be described below with reference to the drawings. It should be noted that the present disclosure is not limited to these examples, but is defined by the claims, and is intended to include all modifications which fall within the scope of the claims and the meaning and scope of equivalents thereof.

Embodiment

Figure 2:
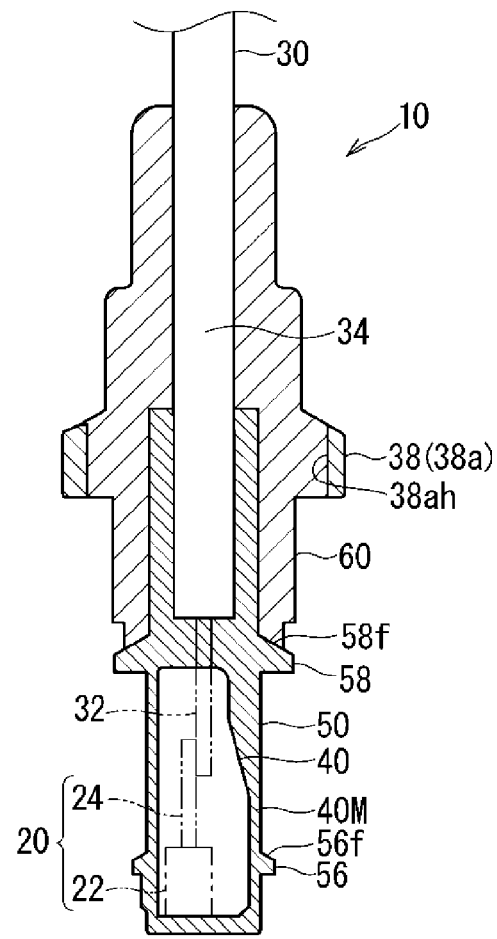
FIG. 2 is a cross-sectional view taken along the line II-II in FIG. 1.
Figure 3:
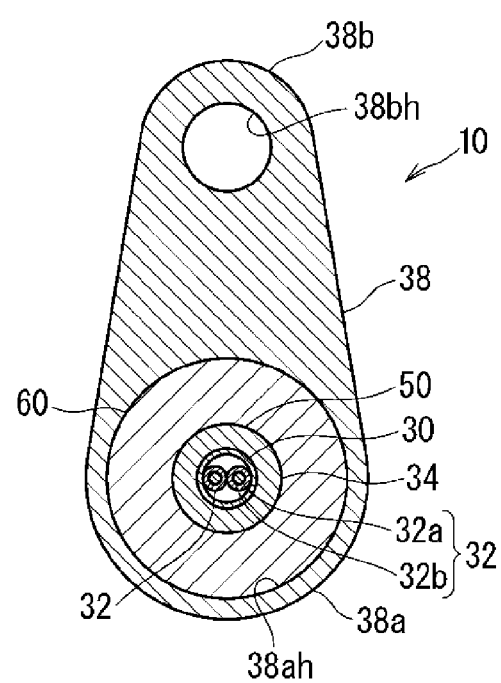
FIG. 3 is a cross-sectional view taken along the line III-III in FIG. 1.

A sensor device according to an embodiment will be described below. FIG. 1 is a front view showing a sensor device 10. FIG. 2 is a cross-sectional view taken along the line II-II in FIG. 1. FIG. 3 is a cross-sectional view taken along the line III-III in FIG. 1. In FIG. 2, an outer shape, rather than a cross section, is shown for a sensor element 20, an inner holder part 40, and a wiring member 30.

The sensor device 10 includes a sensor element 20, a wiring member 30, a first resin molded part 50, and a second resin molded part 60. The sensor element 20 is connected to the wiring member 30. The first resin molded part 50 covers the sensor element 20 and an end portion of the wiring member 30. The second resin molded part 60 is a portion molded separately from the first resin molded part 50. The second resin molded part 60 is combined with the first resin molded part 50 into an integral piece. The first resin molded part 50 and the second resin molded part 60 are molded separately, and constitute an integral resin molded part and cover the sensor element 20 and the end portion of the wiring member 30.

More specifically, the sensor element 20 is an element that detects a physical quantity such as magnetism, light, and temperature, or an amount of change thereof. Here, the sensor element 20 includes an element main body part 22 and a lead part 24. The element main body part 22 is formed in a square shape, for example. The lead part 24 is an elongated portion made of metal or the like. The lead part 24 extends outward from the element main body part 22. An output signal from the sensor element 20 is output to an external device via the lead part 24. The sensor device 10 can be used, for example, as a sensor that detects a rotational speed of a wheel in a vehicle. More specifically, the sensor device 10 may be used as a sensor for an ABS (anti-lock brake system).

The wiring member 30 is connected to the sensor element 20. The wiring member 30 includes at least one linear conductor. Here, the wiring member 30 includes a plurality of (here, two) wires 32. Each wire 32 includes a core wire 32a serving as a conductor, and an insulating covering 32b surrounding the core wire 32a. The plurality of wires 32 are covered by a sheath 34 in a state in which they are bundled together. The sheath 34 is a covering made of resin or the like. The plurality of wires 32 extend from an end of the sheath 34. Each of the core wires 32a is exposed at an end portion of the corresponding one of the plurality of wires 32. The core wires 32a at the respective end portions of the plurality of wires 32 are connected to the lead part 24. The connection between the core wires 32a and the lead part 24 may be achieved through soldering or crimping, for example. The wiring member may be constituted by a single wire. The wiring member may be a member formed by a plurality of wires that are bundled so as to be exposed without being covered by the sheath.

The first resin molded part 50 covers the sensor element 20 and the end portion of the wiring member 30. Here, the sensor element 20, and the connection portion between the sensor element 20 and the wiring member 30 are held in a fixed orientation by an inner holder part 40. For example, the inner holder part 40 is a resin molded portion molded using, as insert portions, the sensor element 20, and the connection portion between the lead part and the core wire 32a. A component in which the sensor element 20, and the connection portion between the sensor element 20 and the wiring member 30 are held by the inner holder part 40 may be considered as an intermediate component 40M. By molding the first resin molded part 50 using such an intermediate component 40M as an insert portion, the sensor element 20 is embedded at a correct position in the first resin molded part 50. By molding the first resin molded part 50 so as to cover the inner holder part 40, the waterproofness for the sensor element 20 is increased. It is not essential that the inner holder part 40 is a component formed by molding using the sensor element 20 and so forth as an insert portion. For example, the inner holder part 40 may be molded in a shape that enables the sensor element 20 and so forth to be fitted therein, and the sensor element 20 and the like may be fitted therein. It is also not essential that the sensor device 10 includes the inner holder part 40. The first resin molded part 50 may directly cover the sensor element 20.

The first resin molded part 50 covers the sensor element 20 via the inner holder part 40. In addition, the first resin molded part 50 covers an end portion of the wiring member 30, here an end portion of the sheath 34. That is, the first resin molded part 50 covers a portion extending from the sensor element 20 to an end portion of the sheath 34. Such a first resin molded part 50 is a member that covers the sensor element 20 and an end portion of the wiring member 30 that is connected to the sensor element 20 so as to maintain the sensor element 20 and the end portion in a fixed positional relationship.

The second resin molded part 60 is a portion molded separately from the first resin molded part 50 and is combined with the first resin molded part 50 into an integral piece. Since the first resin molded part 50 and the second resin molded part 60 are molded separately, it is considered that a boundary appears between the first resin molded part 50 and the second resin molded part 60 even if they are made of the same material.

The first resin molded part 50 and the second resin molded part 60 separately and directly cover regions of the end portion of the wiring member 30 that are different in the extension direction of the wiring member 30. Here, the second resin molded part 60 covers a portion of the first resin molded part 50 on a side on which the wiring member 30 extends. Additionally, the second resin molded part 60 extends, relative to the first resin molded part 50, to the side on which the wiring member 30 extends, and also covers the sheath 34 of the wiring member 30 that extends from the first resin molded part 50. That is, of the end portion of the wiring member 30 connected to the sensor element 20, a portion located closer to the sensor element 20 is directly covered by the first resin molded part 50, and a portion located more distant from the sensor element 20 is directly covered by the second resin molded part 60.

It is not essential that the first resin molded part 50 and the second resin molded part 60 separately and directly cover an end portion of the wiring member 30. For example, the second resin molded part may be formed on an outer circumferential side of the first resin molded part, and need not directly cover the wiring member. It is also not essential that the second resin molded part 60 covers the first resin molded part 50. For example, the second resin molded part may be continuous with an end portion of the first resin molded part that is located on a side on which the wiring member extends.

The first resin molded part 50 continuously covers the end portion of the wiring member 30 in the extension direction of the wiring member 30, and the second resin molded part 60 also continuously covers the end portion of the wiring member 30 in the extension direction of the wiring member 30. Here, the expression that the first resin molded part 50 or the second resin molded part 60 continuously covers the end portion of the wiring member 30 means that the first resin molded part 50 or the second resin molded part 60 covers the end portion of the wiring member 30 without exposing the wiring member 30 at any midpoint thereof. That is, no marks of positioning pins for positioning the wiring member 30 when molding the first resin molded part 50 and the second resin molded part 60 are present at any midpoint in the first resin molded part 50 and the second resin molded part 60.

A fixed part 38 is fixed to the second resin molded part 60. Here, the fixed part 38 is fixed to a longitudinal intermediate portion of the second resin molded part 60. The fixed part 38 includes a sensor-side fixed part 38a fixed around the second resin molded part 60, and a vehicle body-side fixed part 38b protruding outward from the sensor-side fixed part 38a. The sensor-side fixed part 38a has a through hole 38ah in which the second resin molded part 60 is to be disposed. The vehicle body-side fixed part 38b has a screw fastening hole 38bh. The second resin molded part 60 may be molded while the fixed part 38 is positioned within a mold. This allows the fixed part 38 to be fixed to an outer circumferential portion of the second resin molded part 60. The fixed part 38 may be fixed to the second resin molded part 60 by fitting the second resin molded part 60 to the through hole 38ah of the fixed part 38. Thus, the second resin molded part 60 may be considered as a portion that forms a shaped portion for fixing the fixed part 38.

With the sensor device 10 configured in this manner, the first resin molded part 50 and the second resin molded part 60 are molded separately, and therefore the thermal effect on the wiring member 30 is reduced. For example, when portions respectively corresponding to the first resin molded part 50 and the second resin molded part 60 are molded as a single resin molded part, a heated resin melt is supplied around the wiring member 30 in an amount corresponding to the first resin molded part 50 and the second resin molded part 60. This may increase the thermal effect on the wiring member 30. In contrast, when the first resin molded part 50 and the second resin molded part 60 are molded separately, a heated resin melt in an amount corresponding to the first resin molded part 50, and a heated resin melt in an amount corresponding to the second resin molded part 60 are supplied around the wiring member 30 in separate occasions. Accordingly, the amount of heat applied to the wiring member 30 is reduced, and the length of time during which the wiring member 30 is kept at high temperature is also reduced. This reduces the thermal effect on the wiring member 30. Accordingly, the thermal expansion of the wiring member 30 is suppressed, and the contraction of the wiring member 30 after thermal expansion is also suppressed. By supplying the heated resin melt in separate occasions, it is possible to reduce the thickness of the first resin molded part 50, thus reducing sink marks. As a result of these, the adhesion between the wiring member 30 and the first resin molded part 50 is improved, and the waterproofness between the end portion of the wiring member 30 and the first resin molded part 50 is further improved. Similarly, the adhesion between the wiring member 30 and the second resin molded part 60 is improved, and the waterproofness between the end portion of the wiring member 30 and the second resin molded part 60 is further improved. As a result of the first resin molded part 50 and the second resin molded part 60 being combined, a desired shape as the sensor device 10 is formed. For example, a shape is achieved in which the shape of the wiring member 30 extending from the sensor element 20 is kept constant by the first resin molded part 50, and the fixed part 38 is held in a predetermined orientation at a predetermined position by the second resin molded part 60.

As a result of the first resin molded part 50 and the second resin molded part 60 separately and directly covering the respective regions of the end portion of the wiring member 30 that are different in the extension direction of the wiring member 30, the length by which each of the first resin molded part 50 and the second resin molded part 60 directly covers the end portion of the wiring member 30 is reduced. Accordingly, when molding the first resin molded part 50 and the second resin molded part 60, it is possible to eliminate or reduce the locations at which the wiring member 30 is positioned within a mold space. This further improves the waterproofness.

In this case, an exterior member such as a tubular elastic member or adhesive tape may be externally attached to the end portion of the wiring member, and the exterior member may constitute a portion of the wiring member. In this case, at least one of the first resin molded part 50 and the second resin molded part 60 directly covers the wiring member by directly covering the exterior member.

As described above, when the length by which the wiring member 30 is held is reduced in the first resin molded part 50 and the second resin molded part 60, and thus the need to provide a positioning pin is eliminated, it is possible to easily realize a configuration in which the first resin molded part 50 and the second resin molded part 60 continuously cover the end portion of the wiring member 30 as in the case of the embodiment. This further improves the waterproofness between the wiring member 30 and each of the first resin molded part 50 and the second resin molded part 60.

In the sensor device 10 described above, the first resin molded part 50 includes a plurality of resin-stopping annular protrusions 56 and 58. Here, the plurality of resin-stopping annular protrusions 56 and 58 include a first resin-stopping annular protrusion 56 and a second resin-stopping annular protrusion 58. In a direction in which the wiring member 30 extends from the sensor element 20, the distance to the sensor element 20 is different between the first resin-stopping annular protrusion 56 and the second resin-stopping annular protrusion 58. The second resin-stopping annular protrusion 58 is formed at a position more distant from the sensor element 20 than the first resin-stopping annular protrusion 56 is.

Here, the first resin-stopping annular protrusion 56 is formed on the first resin molded part 50 at a portion in which the element main body portion is embedded. The first resin-stopping annular protrusion 56 is formed in the shape of an annular projection protruding outward in the outer circumferential direction of the first resin molded part 50. A surface of the first resin-stopping annular protrusion 56 that is located on a side on which the wiring member 30 extends is formed as a sealing surface 56f that extends gradually away from the wiring member 30 toward the outer side in a protruding direction (outer circumferential side) thereof. The sealing surface 56f is also formed in an annular shape in the circumferential direction of the first resin-stopping annular protrusion 56.

The second resin-stopping annular protrusion 58 is provided on the first resin molded part 50 at a position away from the side on which the wiring member 30 extends from the sensor element 20. Here, the second resin-stopping annular protrusion 58 is formed at a longitudinal intermediate portion of the first resin molded part 50. The second resin-stopping annular protrusion 58 is formed in the shape of an annular projection protruding outward in the outer circumferential direction of the first resin molded part 50. A surface of the second resin-stopping annular protrusion 58 that is located on a side on which the wiring member 30 extends is formed as a sealing surface 58f that extends gradually away from the wiring member 30 toward the outer side in a protruding direction (outer circumferential side) thereof. The sealing surface 58f is also formed in an annular shape in the circumferential direction of the second resin-stopping annular protrusion 58.

The second resin molded part 60 covers a portion of the first resin molded part 50 while the second resin molded part 60 is continuous with one of the plurality of resin-stopping annular protrusions 56 and 58. In the present embodiment, the second resin molded part 60 covers a portion of the first resin molded part 50 that extends from the second resin-stopping annular protrusion 58 toward a side on which the wiring member 30 extends, and also covers an end portion of the wiring member 30 that extends from the first resin molded part 50.

Figure 4:
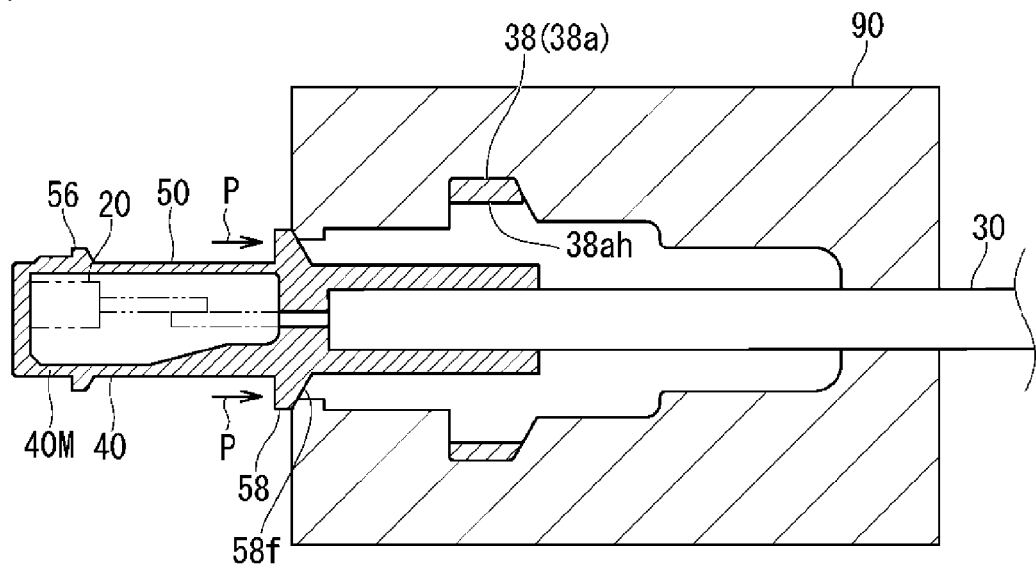
FIG. 4 is a diagram illustrating an example of a step of molding a second resin molded part.

The second resin-stopping annular protrusion 58 described above can serve the function of separating the mold space and the external space from each other when molding the second resin molded part 60, thus suppressing leakage of the heated resin melt filled in the mold space to the outside. FIG. 4 is a diagram illustrating an example of a step of molding the second resin molded part 60.

As shown in FIG. 4, when molding the second resin molded part 60, the first resin molded part 50 that covers the intermediate component 40M and so forth needs to be positioned relative to a mold 90. In this case, a portion of the first resin molded part 50 is disposed inside the mold space of the mold 90, and another portion of the first resin molded part 50 is disposed in an external space that is located externally to the mold space. At a portion of the first resin molded part 50 that protrudes from the mold space, a gap through which the resin contained in the mold space leaks is preferably closed as soon as possible. Therefore, the second resin-stopping annular protrusion 58 is disposed outside the mold 90, and the sealing surface 58f of the second resin-stopping annular protrusion 58 is pressed against the mold 90 (see arrows P). Accordingly, the gap between the mold 90 and the first resin molded part 50 can be closed as soon as possible.

Figure 5:
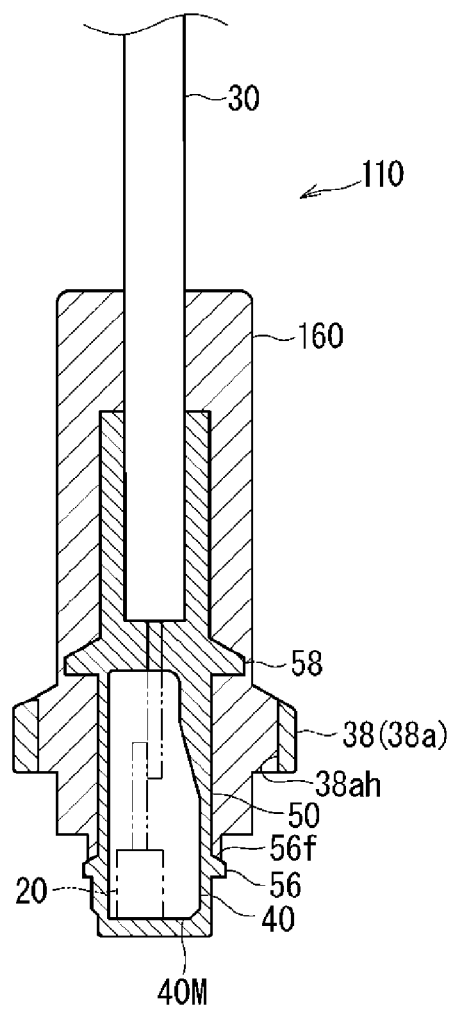
FIG. 5 is a cross-sectional view showing a sensor device according to a modification.

The plurality of resin-stopping annular protrusions 56 and 58 described above are useful for forming second resin molded parts having shapes that are different from each other. That is, as described above, as a result of the first resin molded part 50 and the second resin molded part 60 being combined, a desired shape as the sensor device 10 is formed, and the holding position or the like of the fixed part 38 is determined by the second resin molded part 60, for example. It is conceivable that, as in the case of a sensor device 110 shown in FIG. 5, the holding position or the like of the fixed part 38 is changed by changing the second resin molded part 60 to a second resin molded part 160 having a different shape. In the example shown in FIG. 5, a first resin molded part 50 has the same configuration as that of the first resin molded part 50 of the sensor device 10 described above. The second resin molded part 160 corresponding to the second resin molded part 60 covers a portion of the first resin molded part 50 that extends from the first resin-stopping annular protrusion 56 toward a side on which the wiring member 30 extends, and also covers an end portion of the wiring member 30 that extends from the first resin molded part 50. A second resin-stopping annular protrusion 58 is embedded in the second resin molded part 160. A fixed part 38 is fixed to a longitudinal intermediate portion of the second resin molded part 160. More specifically, a sensor-side fixed part 38a of the fixed part 38 is fixed between the first resin-stopping annular protrusion 56 and the second resin-stopping annular protrusion 58. For example, when molding the second resin molded part 160, the sensor-side fixed part 38a is fixed to the second resin molded part 160 by molding the second resin molded part 160 while the sensor-side fixed part 38a is positioned inside a mold 190. The fixed part 38 of the sensor device 110 may be the same as, or different from the fixed part 38 of the sensor device 10.

Figure 6:
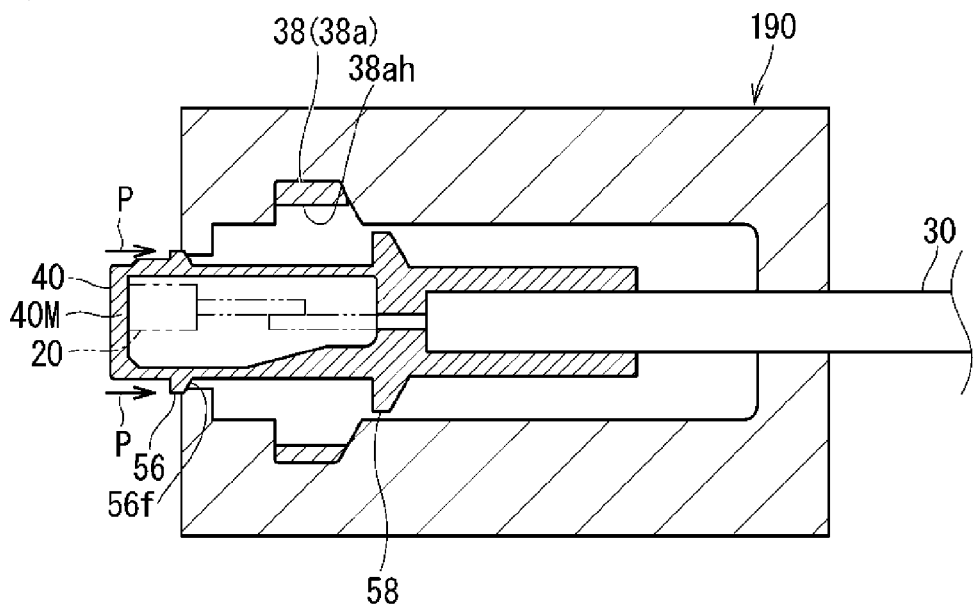
FIG. 6 is a diagram illustrating an example of a step of molding a second resin molded part according to the modification.

The first resin-stopping annular protrusion 56 described above can serve the function of separating the mold space and the external space from each other when molding the second resin molded part 160, thus suppressing leakage of the heated resin melt filled in the mold space to the outside. FIG. 6 is a diagram illustrating an example of a step of molding the second resin molded part 160.

As shown in FIG. 6, when molding the second resin molded part 160, the first resin molded part 50 that covers the intermediate component 40M and so forth needs to be positioned relative to a mold 190. In this case, a portion of the first resin molded part 50 is disposed inside the mold space of the mold 190, and another portion of the first resin molded part 50 is disposed in an external space that is located externally to the mold space. The second resin molded part 160 covers the first resin molded part 50 in more regions than the second resin molded part 60 described above. Accordingly, more portions of the first resin molded part 50 are disposed inside the mold 190. At a portion of the first resin molded part 50 that protrudes from the mold space, a gap through which the resin contained in the mold space leaks is preferably closed as soon as possible. However, the position at which the first resin molded part 50 protrudes from the mold space is different from the position shown in FIG. 4. When molding the second resin molded part 160, the first resin-stopping annular protrusion 56 is disposed outside the mold 190, and the sealing surface 56f of the first resin-stopping annular protrusion 56 is pressed against the mold 190 (see arrows P). Accordingly, the gap between the mold 190 and the first resin molded part 50 can be closed as soon as possible. Thus, the resin for molding the second resin molded part 160 is less likely to leak from the mold 190 to the outside.

Since the first resin molded part 50 includes the plurality of resin-stopping annular protrusions 56 and 58 in this manner, the region in which each of the second resin molded parts 60 and 160 covers the first resin molded part 50 can be flexibly adjusted. Accordingly, the second resin molded parts 60 and 160 having different shapes can be easily formed for the same first resin molded part 50. The second resin molded parts 60 and 160 having different shapes can contribute to changing of the fixing position or the like of the fixed part 38, for example.

In particular, since the first resin-stopping annular protrusion 56 and the second resin-stopping annular protrusion 58 are formed at different distances to the sensor element 20, the second resin molded part 60 that covers a portion of the first resin molded part 50 that is located away from the sensor element 20, and the second resin molded part 160 that covers a portion of the first resin molded part 50 that is located close to the sensor element 20 can be selectively molded. By varying the region in which the second resin molded parts 60 and 160 are formed, the fixing position of the fixed part 38 can be set to be close to the sensor element 20, or to be distant from the sensor element 20.

The configurations described in the embodiment and the modification may be combined as appropriate as long as there are no mutual inconsistencies.

The invention claimed is:

1. A sensor device comprising:
   a sensor element;
   a wiring member connected to the sensor element;
   a first resin molded part that covers the sensor element and an end portion of the wiring member;
   a second resin molded part molded separately from the first resin molded part and combined with the first resin molded part into an integral piece; and
   wherein the first resin molded part includes a plurality of resin-stopping annular protrusions, and the second resin molded part covers a portion of the first resin molded part while the second resin molded part is continuous with one of the plurality of resin-stopping annular protrusions.

2. The sensor device according to claim 1, wherein the first resin molded part and the second resin molded part separately and directly cover regions of the end portion of the wiring member that are different in an extension direction of the wiring member.

3. The sensor device according to claim 2, wherein the first resin molded part and the second resin molded part continuously cover the end portion of the wiring member.

4. The sensor device according to claim 1, wherein the plurality of resin-stopping annular protrusions include a first resin-stopping annular protrusion, and a second resin-stopping annular protrusion formed at a position more distant from the sensor element than the first resin-stopping annular protrusion is, and
   the second resin molded part covers a portion of the first resin molded part that extends from the second resin-stopping annular protrusion toward a side on which the wiring member extends.

5. The sensor device according to claim 2, wherein the plurality of resin-stopping annular protrusions include a first resin-stopping annular protrusion, and a second resin-stopping annular protrusion formed at a position more distant from the sensor element than the first resin-stopping annular protrusion is, and
   the second resin molded part covers a portion of the first resin molded part that extends from the second resin-stopping annular protrusion toward a side on which the wiring member extends.

* * * * *